United States Patent [19]

Economikos

[11] Patent Number: 5,235,154
[45] Date of Patent: Aug. 10, 1993

[54] LASER REMOVAL OF METAL INTERCONNECTS

[75] Inventor: Laertis Economikos, Wappingers Falls, N.Y.

[73] Assignee: International Business Machines Corporation, Armonk, N.Y.

[21] Appl. No.: 874,924

[22] Filed: Apr. 28, 1992

[51] Int. Cl.$^5$ .................................. B23K 26/00
[52] U.S. Cl. ................... 219/121.69; 219/121.68; 338/195
[58] Field of Search ............ 219/219, 121.68, 121.69, 219/121.65, 121.66; 338/195

[56] References Cited

U.S. PATENT DOCUMENTS

| | | | |
|---|---|---|---|
| 4,081,653 | 3/1978 | Koo et al. | 219/121.69 |
| 4,340,654 | 7/1982 | Campi | 430/5 |
| 4,463,073 | 7/1984 | Miyauchi et al. | 430/5 |
| 4,609,566 | 9/1986 | Katsurou et al. | 427/53.1 |
| 4,636,403 | 1/1987 | Fisanick et al. | 427/53.1 |
| 4,668,528 | 5/1987 | Ehrlich et al. | 427/53.1 |
| 4,727,234 | 2/1988 | Oprysko et al. | 219/121 |
| 4,756,927 | 6/1988 | Black et al. | 427/53.1 |
| 4,778,693 | 10/1988 | Drozdowicz et al. | 427/53.1 |
| 4,849,642 | 7/1989 | Katsumi | 250/492 |
| 4,925,755 | 5/1990 | Yamaguchi et al. | 430/5 |
| 4,928,838 | 5/1990 | Imamura | 219/121.69 |
| 4,940,508 | 7/1990 | Shamouillin et al. | 219/121.68 X |
| 4,948,623 | 8/1990 | Beach et al. | 427/35 |
| 4,950,498 | 8/1990 | Kaito | 427/38 |
| 4,962,294 | 10/1990 | Beckham et al. | 219/121.68 |

OTHER PUBLICATIONS

R. L. Jackson, et al., "Mechanisms of Laser-Induced Deposition From the Gas Phase," RJ 5664 (57163), May 26, 1987.

*Primary Examiner*—C. L. Albritton

[57] ABSTRACT

Disbonded two-level (bimetal) metal interconnections are removed by first vaporizing metal in the lower level that is exposed by the narrower metal on the upper level using a pulsed laser beam having an energy density above a vaporization threshold in a first beam width and then vaporizing the remaining portion of the metal in both levels using the laser beam with a narrower beam width that covers only the narrower width of the upper level metal.

16 Claims, 1 Drawing Sheet

LASER REMOVAL OF METAL INTERCONNECTS

TECHNICAL FIELD

The invention relates to the manufacture of integrated circuits and the packaging enclosures for integrated circuits, in particular to a method of repairing metal interconnection lines that have become disbonded.

BACKGROUND ART

The art has long sought a method of repairing disbonded metal interconnection lines on integrated circuits or packages. A number of techniques have been developed, including the vaporization of the damaged portion of the metal by heating with a laser. Unfortunately, prior art repair methods suffer from a drawback that the underlying insulating layer below the metal, typically an organic dielectric such as polyimide, is also damaged. U.S. Pat. No. 4,081,653, relies on damage to the underlying insulating film to generate an explosive impetus to the metal. Such damage to the insulator creates a potential for short circuits to connection layers below the damaged metal and presents a significant obstacle to repairs.

A prior art technique used to deposit a film of metal for repairs is illustrated in U S. Pat. No. 4,948,623 and may be used together with the invention disclosed herein.

Many prior art techniques have been devised for the repair of photomasks that rely on selective heating of a small area to induce deposition of a repair metal. Such techniques are not applicable to the problem solved by the present invention because of the heat generated in the laser focal spot.

SUMMARY OF THE INVENTION

The invention relates to a method of repairing disbonded metal interconnects by laser vaporization in which two metal layers that are superimposed have become disbonded, after which the break is filled by chemical vapor deposition.

A feature of the invention is the use of separate laser beam apertures in a two step process in which a larger aperture is first heated after which a smaller aperture is heated.

BEST MODE OF CARRYING OUT THE INVENTION

Figure 1:
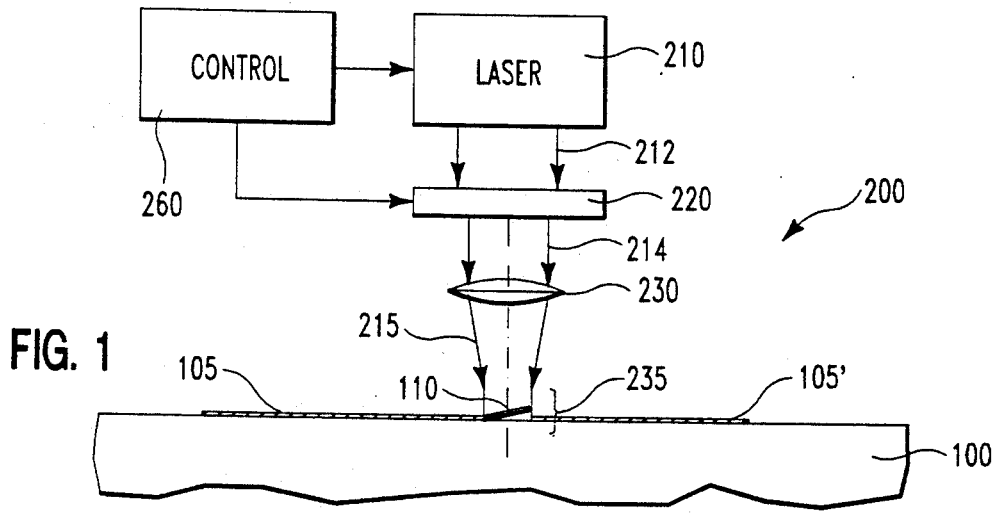
FIG. 1 illustrates schematically a system for practicing the invention.

Referring to FIG. 1, there is shown in schematic form a laser system for practicing the invention, in which an insulating substrate 100 has deposited on its top surface a metal interconnection network 105, 105' a portion of which, denoted by the numeral 110, has become disbonded. Substrate 100 may be the bottom of a chip carrier that will hold one or more integrated circuits and provide a network of interconnections that couple the terminals on the chips to terminals on the outside of the package. Alternatively, block 100 can represent an integrated circuit itself, with the semiconductor substrate and lower levels of polysilicon interconnection represented schematically by the box.

A laser 210 emits a beam 212 that is controlled in size by a movable rectangular aperture 220 to provide a beam 214 of correct size to cover the disbonded area without extending to damage the underlying insulator 120. The reduced beam 214 from aperture 220 is focused by lens 230 into a converging beam 215 that strikes the disbonded metal and vaporizes it. Beam 214 has a beam waist denoted by the bracket labeled 235 that provides depth of focus to accommodate varying heights of disbonds. The figure is not drawn to scale since the height of the disbond will be on the order of microns and the distance to the laser will be on the order of meters. A laser beam of typical quality will have ample depth of focus for the purpose of this application, since any deviation of the optics makes the focus less sharp. The laser 210 is illustratively pulsed under the control of control unit 260, which may be a programmed general purpose computer. Optionally, control unit 260 may also control aperture 220 or it may be controlled manually.

Figure 2:
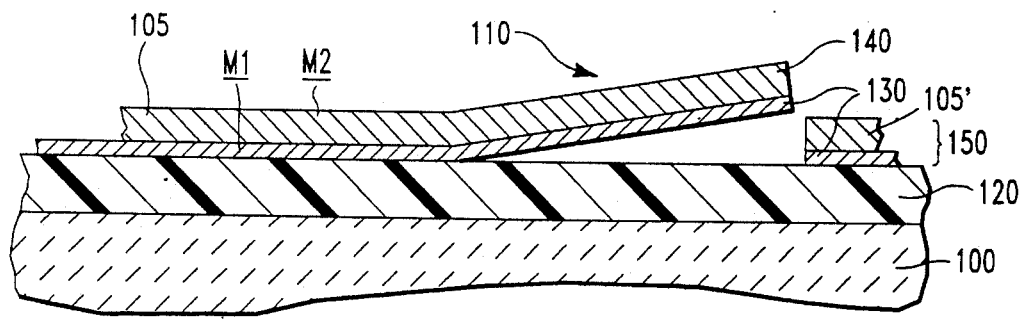
FIGS. 2 and 3 illustrate a disbonded metal portion to be repaired.

Referring now to FIG. 2, there is shown a side view of an enlarged portion 110 of a disbonded area between bonded portions 105, 105' of the interconnection network. A box at the bottom of the drawing denoted by the numeral 100 represents the underlying ceramic or glass/ceramic substrate containing the lower level of interconnections. The layer denoted with the numeral 120 is a polyimide insulating layer between the lowest level of metal and the underlying layers.

The two layers of metal, metal 1, denoted with the numeral 130 and having an illustrative thickness of 2 microns, and metal 2, denoted with the numeral 140 and having an illustrative thickness of 7 microns, are, in this region of the circuit, superimposed on one another without any intervening insulation.

The advantage of this structure, as is known in the art, is that defects in one metal layer will not cause an open circuit because the other layer will still be able to carry the signal. A disadvantage of this structure, from the point of view of making repairs, is that disbonds have been impossible to repair. If one attempts to remove the disbonded area by laser machining, as is done with single layers of metal in the prior art, variations in the removal of the thick layer result in damage to the polyimide in areas where the composite metal is thin or where the removal process is irregular. Since the polyimide is only a few microns thick, it is impossible to make a patch of that thickness with existing techniques.

Within substrate 100, there is a set of vertical metal members or studs that pass through one or two layers of polyimide to a set of metal interconnections encapsulated in a glass/ceramic matrix. The interconnection network 105 makes contact with studs at various points to carry signals from integrated circuits out to the pins on the package.

In this area, the two metal lines have a broken connection on the right hand denoted by the curved lines at the right hand edge of the metal, which is raised up a distance, denoted by the bracket with the numeral 150, above polyimide 120.

The object of the invention is to remove the metal that is lifted up (plus some tolerance on the bonded portion 105) without damaging the polyimide 120. Some slight damage to layer 120 is tolerable, of course, but if the damaged portion exposes some of the underlying metal network, short circuits can result between network 105 and the new layer of metal that will be used to repair the disbond after the loose metal 110 is removed. A conventional chemical vapor deposition process will be used to deposit a replacement metal patch by known techniques, such as that illustrated in an IBM Research Report RJ 5664 (57163), entitled Mechanisms of Laser-Induced Deposition From the Gas Phase.

Also, if the step height from the surface down into the damaged area is too great, then the repair metal will not be able to cover the step, and there will be an open circuit.

Figure 3:
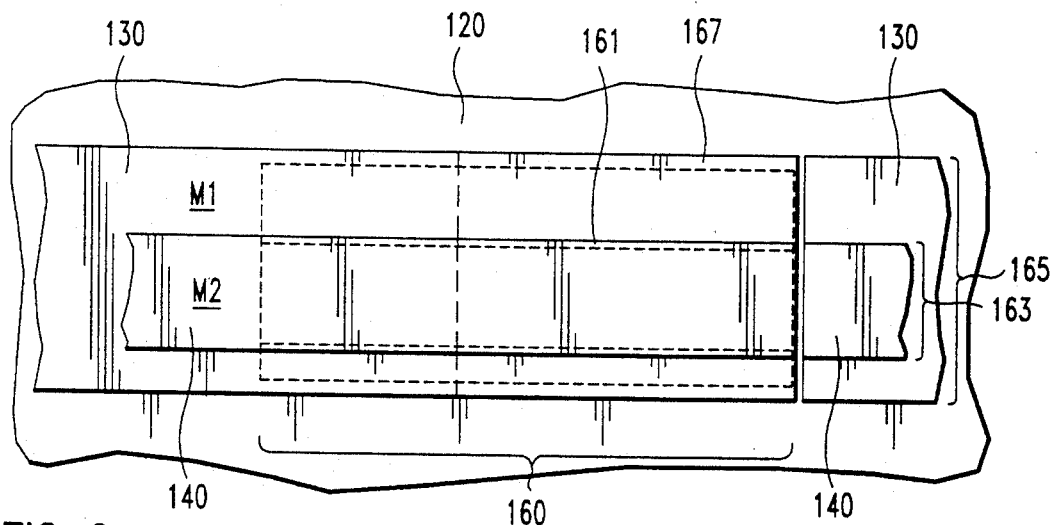

Referring now to FIG. 3, there is shown a top view of the same area of FIG. 2. Metal 1 is wider in extent than metal 2, having extensions on both sides by some amount. The difference in size between metal 1 and Metal 2 will depend on the usual engineering considerations, such as the amount of space between features in the Metal 1 level.

Metal 2 is shown as not being centered above metal 1 because of inevitable alignment errors. The length of the disbonded area plus a tolerance is denoted by the horizontal bracket labeled 160. The width of metal 2 is denoted by the bracket 163 while the width of metal 1 is denoted by the bracket 165. The length 160 and the width 165 define the larger aperture or the metal 1 aperture and the length 160 and the widths 163 denote the metal 2 aperture. The apertures are indicated with the dotted rectangles 167 and 161 that are shown as being inside the dimension of the metal areas in order to avoid damage to insulator 120.

In operation, aperture 220 is controlled so that the (rectangular) beam 215 at the beam waist just covers the metal 1 aperture and the laser is pulsed a sufficient number of times to remove a portion of the metal 2 and those portions of metal 1 that stick out from the covering metal 2. In a second step, the aperture is decreased in size to that of the metal 2 aperture and the laser 210 is pulsed again to remove the remaining portion of the metal 2 and the underlying metal 1 below metal 2. The first step is carried out until the exposed portions of metal 1 have been removed plus a tolerance.

One skilled in the art would have thought that it would have been preferable have a smaller aperture to remove the metal 2 first and then to expand the aperture if necessary to remove the metal 1. It has been found, however, that such a method has the drawback that it is difficult to control the removal of metal 2 evenly and that the polyimide is damaged during the removal of the metal 1 layer because the variations in thickness of the metal remaining after the previous step are comparable to the tolerance in the removal process, so that the polyimide is damaged in areas where a greater than normal amount of metal 2 was removed.

The inventive method has given superior performance in removing both metal 1 (2 μm thick) and metal 2 (7 μm thick) over regions having lengths of from 40-130 μm and widths 4-23 μm without any significant damage to the underlying polyimide 120.

This method has successfully been used with a XeCl excimer laser manufactured by XMR Corp. and having a preferable energy density per pulse of 8.3J/cm$^2$ at a wavelength of 308 nm and at a nominal pulse duration of 15 ns. For the foregoing parameters, 20 pulses remove 9 μm of a conventional alloy of Au/Ni/Cr/Cu.

The method is not restricted to an excimer laser and may be practiced with other lasers that are capable of metal vaporization, such as YAG or $CO_2$ lasers. Those skilled in the art will readily be able to modify the pulse energy density and duration to accommodate different alloys and metal thicknesses. The energy density must be above a vaporization threshold, above which the beam will vaporize the top surface of the metal and not so high that the underlying polyimide is severely damaged. The use of a lower energy beam will slightly increase the number of pulses required. Illustratively, the first step may be performed with an energy density of 6.5 J/cm$^2$ and the second step may be performed with a higher energy density of about 8-14 J/cm$^2$.

Slight damage that does not penetrate the entire thickness of the polyimide layer and therefore does not present a risk of forming short circuits is acceptable. The insulator need not be organic, and the invention may be applied with an intervening inorganic layer such as oxide or nitride between the metal and the organic layer, or with an entirely inorganic layer. For example, a thin oxide layer might be used to provide a moisture barrier above a polyimide lower layer. Since oxide is transparent, the laser beam can penetrate and damage the underlying layer even if the oxide is not damaged. The pulse must not be too long or the top surface will be cooled by conduction before it vaporizes. This condition is not restrictive and a broad range of pulses are acceptable. The relative thickness of the metal layers is not critical and interconnects with equal thicknesses of metal or with the upper metal thinner are acceptable. It is not necessary that the lower level be the wider one and the invention may be practiced with a metal network in which the upper level is wider and the first aperture covers the upper metal that is outside the width of the lower level. In that case, the first metal level is the upper level.

The invention is not restricted to disbonded portions of metal and it may be practiced with a removal portion of metal that has a good bond. For example, the invention may be used to personalize semicustom chips by cutting metal lines instead of the conventional method of blowing fuses. In that case, the portion being removed is referred to as a personalization link and its removal changes the properties of the circuit. For example, the link may connect an optional subcircuit to the power bus and cutting the link will disable that option.

Accordingly, the following claims are not intended to be limited to the embodiment of the invention illustrated above.

I claim:

1. A method of removing a disbonded portion of a metal interconnection network formed of a predetermined network metal and disposed on an insulating substrate above an underlying organic insulator layer, said disbonded portion comprising a first level of metal having a first level width and a second metal level having a second level width less than said first level width, comprising the steps of:

vaporizing a first sub-portion of said disbonded portion by directing and repetitively pulsing a pulsed laser beam having a first predetermined energy density and first predetermined beam dimensions covering a disbonded length and said first level width on said disbonded portion until that sub-portion of said first level metal exposed by said second level metal is removed; and vaporizing a second sub-portion of said disbonded portion by directing said pulsed laser beam having a second predetermined energy density and a second predetermined beam dimension covering said disbonded length and said second level width on said disbonded portion until a remaining sub-portion of said second level metal remaining after said step of vaporizing is removed.

2. A method according to claim 1, in which said step of vaporizing said first sub-portion is preceded by a first setup step of adjusting said controllable aperture to set said first predetermined beam dimensions to said first level width; and said step of vaporizing said remaining portion is preceded by a second setup step of adjusting said controllable aperture to set said second predetermined beam dimensions to said- second level width.

3. A method according to claim 2, in which said laser is a pulsed excimer laser.

4. A method according to claim 2, in which said laser is a pulsed $CO_2$ laser.

5. A method according to claim 2, in which said laser is a pulsed YAG laser.

6. A method according to any of claims 1–5, in which said first and second energy densities are above a vaporization threshold.

7. A method of removing a removal portion of a metal interconnection network formed of a predetermined network metal and disposed on an upper layer of an integrated circuit above an underlying insulator layer, said removal portion comprising a first level of metal having a first level width and a second metal level having a second level width less than said first level width, comprising the steps of:

vaporizing a first sub-portion of said removal portion by directing and repetitively pulsing a pulsed laser beam having a first predetermined energy density and first predetermined beam dimensions covering a removal length and said first level width on said removal portion unit that sub-portion of said first level metal outside said second level metal is removed; and vaporizing a second sub-portion of said removal portion by directing said pulsed laser beam having a second predetermined energy density and a second predetermined beam dimension covering said removal length and said second level width on said removal portion until a remaining sub-portion of said second level metal remaining after said stp of vaporizing is removed.

8. A method according to claim 7, in which said step of vaporizing said first sub-portion is preceded by a first setup step of adjusting a controllable aperture intercepting said laser beam to set said first predetermined beam dimensions to said first level width; and said step of vaporizing said remaining portion is preceded by a second setup step of adjusting said controllable aperture to set said second predetermined beam dimensions to said second level width.

9. A method according to claim 7, in which said insulator is organic.

10. A method according to claim 7, in which said removal portion is disbonded from said insulator.

11. A method according to claim 7, in which said removal portion is disbonded from said insulator and further including a step of replacing said removal portion with a replacement portion of metal, whereby said method is a method of repairing an integrated circuit.

12. A method according to claim 7, in which said removal portion is a personalization link the removal of which alters the properties of the circuit, whereby said method is a method of personalizing said integrated circuit.

13. A method according to any of claims 7–12, in which said first and second energy densities are above a vaporization threshold.

14. A method according to claim 13, in which said laser is a pulsed excimer laser.

15. A method according to claim 13, in which said laser is a pulsed $CO_2$ laser.

16. A method according to claim 13, in which said laser is a pulsed YAG laser.

* * * * *

UNITED STATES PATENT AND TRADEMARK OFFICE
CERTIFICATE OF CORRECTION

PATENT NO. : 5,235,154
DATED : August 10, 1993
INVENTOR(S) : Laertis Economikos

It is certified that error appears in the above-identified patent and that said Letters Patent is hereby corrected as shown below:

In column 5, line 36: change "unit" to --until--.

In column 6, line 5: change "stp" to --step--.

Signed and Sealed this

Twenty-seventh Day of June, 1995

BRUCE LEHMAN

Attest:

*Attesting Officer*

*Commissioner of Patents and Trademarks*